US006622230B1

United States Patent
Yano et al.

(10) Patent No.: US 6,622,230 B1
(45) Date of Patent: Sep. 16, 2003

(54) MULTI-SET BLOCK ERASE

(75) Inventors: Masaru Yano, Sunnyvale, CA (US); Shane Hollmer, San Jose, CA (US); Michael Chung, San Jose, CA (US)

(73) Assignees: Advanced Micro Devices, Inc., Sunnyvale, CA (US); Fujitsu Limited, Kanagawa (JP)

(*) Notice: Subject to any disclaimer, the term of this patent is extended or adjusted under 35 U.S.C. 154(b) by 185 days.

(21) Appl. No.: 09/724,675

(22) Filed: Nov. 28, 2000

(51) Int. Cl.$^7$ ............................................... G06F 12/06
(52) U.S. Cl. ........................... 711/209; 711/5; 711/103; 365/230.03
(58) Field of Search ........................ 365/185.11, 230.03, 365/238.5; 711/5, 209, 212, 217, 103

(56) References Cited

U.S. PATENT DOCUMENTS

| | | | | | |
|---|---|---|---|---|---|
| 4,862,417 A | * | 8/1989 | List et al. | .................... | 365/200 |
| 5,495,442 A | | 2/1996 | Cernea et al. | ......... | 365/185.03 |
| 5,654,925 A | * | 8/1997 | Koh et al. | .................. | 365/201 |
| 5,677,864 A | * | 10/1997 | Chung | ........................ | 365/63 |
| 6,047,352 A | * | 4/2000 | Lakhani et al. | ................ | 711/5 |
| 6,160,750 A | * | 12/2000 | Shieh | .................... | 365/230.03 |

* cited by examiner

Primary Examiner—Gary Portka

(57) ABSTRACT

A method is provided for selecting a group of memory blocks in a flash memory device given their starting and ending addresses. The method compares the two addresses to determine the multi-block first bit location which is the most significant bit location where the starting and ending addresses have different bits. The method then generates a converted memory block address where bits more significant than the multi-block first bit location are the ending address bits and where bits less significant than, or equal in significance to, the multi-block first bit location are equal to a logic 1. The method also generates a converted complementary memory block address identical to the other converted address except that bits in the bit locations more significant than the multi-block first bit location are the complements of the ending address bits. The method then pre-decodes the two converted addresses to generate sets of pre-decoded z-signals corresponding to the block addresses included in a group of the starting and ending addresses and all the addresses between them. Finally, the method decodes the pre-decoded z-signals to generate signals selecting memory blocks whose addresses are in that group.

14 Claims, 11 Drawing Sheets

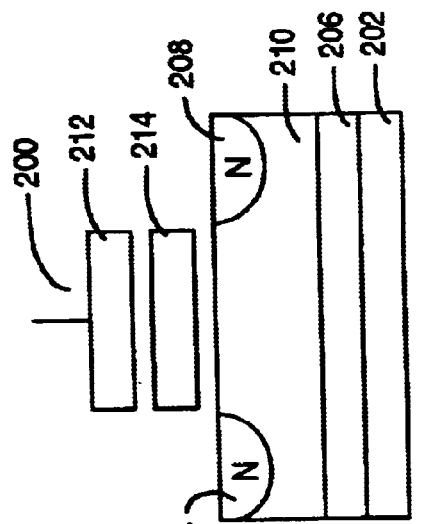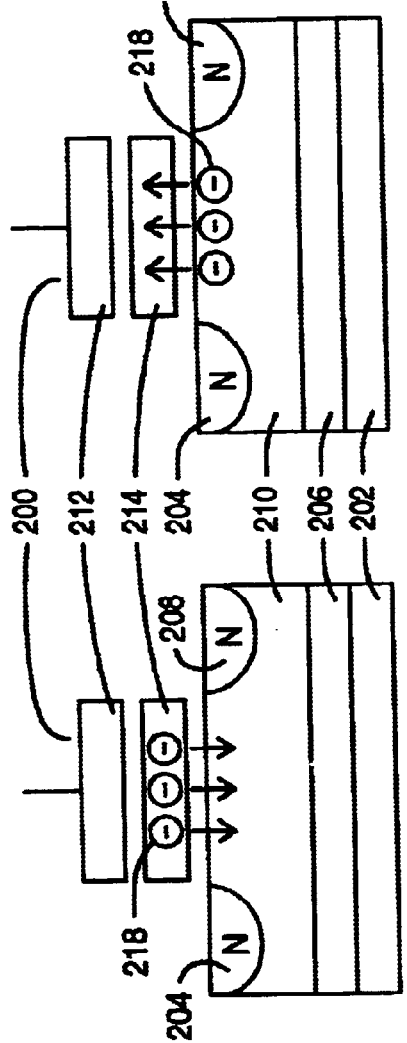

| | Z1(Decoded by A2,A3,Z0(Decoded by A0,A1) | | A3 A2 A1 A0 |
|---|---|---|---|
| | Z10 Z11 Z12 Z13 | Z00 Z01 Z02 Z03 | |
| BLOCK 0 | 1000 | 1000 | 0000 |
| BLOCK 1 | 1000 | 0100 | 0001 |
| BLOCK 2 | 1000 | 0010 | 0010 |
| BLOCK 3 | 1000 | 0001 | 0011 |
| BLOCK 4 | 0100 | 1000 | 0100 |
| BLOCK 5 | 0100 | 0100 | 0101 |
| BLOCK 6 | 0100 | 0010 | 0110 |
| BLOCK 7 | 0100 | 0001 | 0111 |
| BLOCK 8 | 0010 | 1000 | 1000 |
| BLOCK 9 | 0010 | 0100 | 1001 |
| BLOCK 10 | 0010 | 0010 | 1010 |
| BLOCK 11 | 0010 | 0001 | 1011 |
| BLOCK 12 | 0001 | 1000 | 1100 |
| BLOCK 13 | 0001 | 0100 | 1101 |
| BLOCK 14 | 0001 | 0010 | 1110 |
| BLOCK 15 | 0001 | 0001 | 1111 |

* START = 0000
** END = 0111
* Z10 Z11 = 1, Z00 Z01 Z02 Z03 = 1

| | Z1(Decoded by A2,A3,Z0(Decoded by A0,A1) | | A3 A2 A1 A0 |
|---|---|---|---|
| | Z10 Z11 Z12 Z13 | Z00 Z01 Z02 Z03 | |
| BLOCK 0 | 1000 | 1000 | 0000 |
| BLOCK 1 | 1000 | 0100 | 0001 |
| BLOCK 2 | 1000 | 0010 | 0010 |
| BLOCK 3 | 1000 | 0001 | 0011 |
| BLOCK 4 | 0100 | 1000 | 0100 |
| BLOCK 5 | 0100 | 0100 | 0101 |
| BLOCK 6 | 0100 | 0010 | 0110 |
| BLOCK 7 | 0100 | 0001 | 0111 |
| BLOCK 8 | 0010 | 1000 | 1000 |
| BLOCK 9 | 0010 | 0100 | 1001 |
| BLOCK 10 | 0010 | 0010 | 1010 |
| BLOCK 11 | 0010 | 0001 | 1011 |
| BLOCK 12 | 0001 | 1000 | 1100 |
| BLOCK 13 | 0001 | 0100 | 1101 |
| BLOCK 14 | 0001 | 0010 | 1110 |
| BLOCK 15 | 0001 | 0001 | 1111 |

* START = 0100
** END = 0111
* Z11 = 1, Z00 Z01 Z02 Z03 = 1

FIGURE 8

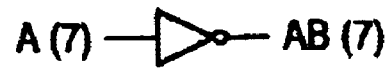
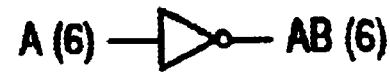
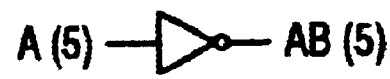
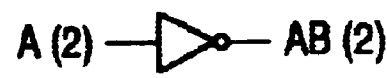
FIGURE 10

MULTI-SET BLOCK ERASE

FIELD OF THE INVENTION

The present invention relates to the field of flash memory devices. More particularly, the invention relates to both a mechanism and method for multi-set block erase in NAND-based flash memory devices.

BACKGROUND OF THE INVENTION

The overall array architecture for memory section of a typical NAND-based flash memory device comprises a core memory accessed by an upper and lower bank of page buffers and a right and left bank of word line or X-decoders. The core memory contains information stored in blocks of memory and individual memory cells or elements within the memory blocks. The right and left word line or X-decoders are used to access specific memory cells within each memory block and the upper and lower bank of page buffers provide the input and output circuitry for each memory cell. The X-decoders contain numerous final decoder circuits, each with a high voltage generating pump. There is generally one final decoder circuit for each memory block. Each final decoder circuit is linked by various predecoder output lines to a predecoder circuit.

The architecture of one memory block in the typical NAND-based flash memory device comprises the individual memory elements and select gates. The memory elements and select gates are embodied in non-volatile, floating gate transistors that may be programmed to a logic state of 0, 1, or other states depending on the particular type of transistor and programming used. The control gates of the transistors that comprise the individual memory elements and select gates in each memory block are addressed by word lines controlled by the addressing system. The memory elements are connected in series with each other and the select gates. The select gates, at the ends of the chain of memory cells, are connected with either the array common voltage Vss or a bitline. A page buffer is connected with a memory block via a bitline. The page buffer includes transistors and supporting circuitry that regulate the flow of data into and out of the memory block and into and out of the external system.

The array architecture associated with the memory device is shown in FIG. 1. The array contains N individual page buffers 110 in each bank of page buffers 102,104; thus, as there are both an upper 102 and lower 104 bank of page buffers, one entire page or word line 112 contains 2N bits. Left 106 and right 108 banks of X-decoders are used to select a particular word line. The core memory 100 is split into a set of M memory blocks 114 with each memory block 114 being L pages wide. This results in a 2N bits/page×L pages/memory block×M memory blocks/core memory=2× L×M×N bytes/core memory. One example of an array architecture used is 256 individual page buffers, a set of 1024 memory blocks with each memory block being 16 pages wide. This results in a 2×256 bytes/page×16 pages/memory block×1024 memory blocks/core memory=8M bytes/core memory. Of course, any numbers presented here are merely illustrative of the principle of the invention as a whole. Those ordinarily skilled in the art will appreciate that the numbers associated with any of these elements, as well as the number of memory cells or elements in the overall device, may be changed without departing from the spirit and scope of the invention.

FIG. 2 shows the architecture of one memory block 114 in the NAND-based flash memory device of FIG. 1 along with the associated page buffer 110. The memory block 114 comprises many parallel strings like the string of 16 individual memory elements 130–145 and two select gates, SG1 116 and SG2 118, for example. As stated before, non-volatile transistors embody the memory elements 130–145 and select gates 116, 118. The word lines 151–166 and select gate lines 150, 167 are connected with the control gates of the memory elements 130–145 and select gates 116, 118. The memory elements 130–145 and select gates SG1 116 and SG2 118 are connected in series. Specifically, the source and drain of the memory elements 130–145 are connected to each other in series. Thus, the source of the first memory element 130 is tied to the drain of the memory second element 131, the source of the second memory element 131 is tied to the drain of the third memory element 132, etc. Accordingly, the select gates 116, 118 are connected to the ends of the chain of memory elements 130–145. The source of SG1 116 is connected with the drain of the first memory element 130, while the drain of SG1 116 is connected with a bitline 170. Similarly, the drain of SG2 118 is connected with the source of the last memory element 145 and the source of SG2 118 is connected with the array common (usually ground) voltage Vss 172.

The memory block 114 is connected with a page buffer 110 via a bitline 170. The page buffer 110 includes necessary circuitry well known in the art. The necessary circuitry may include, for example, a latch for latching data onto and out of the bitline 170, input/output circuitry for transferring data to the external system and assorted supporting circuitry inherent in the necessary circuitry.

Individual memory elements can undergo three distinct operations, which are shown in FIGS. 3, 4 and 5. The three operations are Program, shown in FIG. 3, Erase, shown in FIG. 4, and Read, shown in FIG. 5, and are described below. This discussion will be limited to standard, n-channel, NAND-based non-volatile memory elements, although those ordinarily skilled in the art will appreciate that the basic operations described herein can be easily extended to at least NOR-based non-volatile memory elements and multi-level non-volatile memory elements in which more than two states can be programmed.

The structure of the memory element 200 is well known in the art: a p-type semiconductor well 210 is disposed within a n-type semiconductor well 206. The n-type semiconductor well 206 is contained within a p-type semiconductor substrate 202. A set of n-type semiconductor junctions comprising the source 204 and drain 208 are disposed within the p-type semiconductor well 210. The p-type semiconductor well 210 and n-type semiconductor well 206 are usually maintained at the same voltage during device operation to avoid current flow from one of the well regions to the other.

The memory element further includes a control gate 212 and a floating gate 214. The gates 212, 214 are conventionally formed from polysilicon deposited and patterned on the surface of the substrate, although the floating gate 214 may alternately be formed from an ONO layer. The gates 212, 214 are formed such that an oxide is formed on part of the substrate with the floating gate 214 formed above the oxide. The control gate 212 is formed above the floating gate 214 and isolated from the floating gate 214 by a second oxide. Control signals are applied to the control gate 212.

During the program operation, as shown in FIG. 3, both the source 204 and the drain 208 of the memory element 200 are connected with Vss (usually ground). Prior to programming, the threshold voltage (or turn-on voltage) of the MOSFET is generally designed to be a negative voltage, so that a channel 216 of electrons 218 exists in the p-type semiconductor well 210 when the gate 212 is grounded. The channel 216 is disposed between the source 204 and drain 208 of the memory element 200. A large positive voltage is applied to the control gate 212, which causes electrons 218 to be trapped onto the floating gate 214 via Fowler-Nordheim tunneling. The threshold voltage of the transistor is increased if electrons are trapped on the floating gate 214. In this case, the threshold voltage of the programmed memory element changes from a negative voltage to a positive voltage.

During the erase operation, as shown in FIG. 4, the source 204 and the drain 208 of the memory element 200 are left floating while the control gate 212 is grounded at Vss. A large positive voltage is applied to both the p-type semiconductor well 210 and the n-type semiconductor well 206. As a consequence, the electrons 218 trapped on the floating gate 214 enter the p-type semiconductor well 210 via Fowler-Nordheim tunneling. The threshold voltage thus reverts to the original, unprogrammed threshold voltage of the transistor.

During the read operation, as shown in FIG. 5, the source 204 of the memory element 200 is connected with Vss while the drain is connected with the bitline 170. The voltage applied to the control gate 212 of the memory element 200 is between the threshold voltage of memory elements that have been erased and memory elements that have been programmed. In this case, the threshold voltage of a programmed memory element is positive and that of an erased memory element is negative and thus applying Vss to the control gate 212 is sufficient to differentiate between the two states. The voltage or current is determined on the bitline 170 to ascertain the state of the particular memory element selected, either programmed (0) or erased (1).

The preferred technique for sensing a memory cell, e.g., 130 in a string, e.g., 116, 130–145, 118 (FIG. 2) on a specific word line, e.g., 151 is to charge the bitline 170 before the specific word line 151 is addressed. The bitline 170 is initially charged up to a value close to a predetermined sensing level and then isolated or left floating. Each word line is connected with the control gate of a unique memory cell in each string. In a standard NAND-type flash memory device, to test a specific word line, all of the word line voltages not being tested 152–166 and the select gate voltages 150, 167 are held at a high enough voltage level to turn the memory element 131–145 on or open the channel of the transistor. The applied voltage must be greater than the voltage necessary to turn on a programmed memory element, whose threshold voltage is large, as well as an erased memory element, whose threshold voltage is substantially smaller.

As mentioned above, the voltage applied along the specific word line, e.g., 151 of the memory element to be read, e.g., 130 must be between the voltage necessary to read an erased memory cell and that necessary to read a programmed memory cell. If the specific memory cell being read, e.g., 130 has been erased, when the test voltage is applied, a complete circuit from the bitline 170 to ground 172 is created and the bitline 170 discharges. After a specific amount of time, the voltage on the bitline 170 is read. At this time, if the voltage on the bitline 170 is approximately the original sensing level, 1.0 V for example, then the circuit connecting the bitline 170 to ground 172 was not completed and the memory cell, e.g., 130 has been programmed. Thus, charge stored in the floating gate of the memory cell translates to a high voltage at the sensing node on the bitline and corresponds to a logic value of 0. Similarly, a low voltage at the sensing node on the bitline corresponds to a logic value of 1.

FIG. 6 sets out a block diagram of a portion of the memory architecture closely related to the X-decoding function. Only one side of the two-sided X-decoding function depicted in FIG. 1 is depicted in FIG. 6. The function and configuration of the other side will be apparent to one of skill in the art. The X-decoding function depicted involves several components. The figure depicts the X-decoder 240, the memory blocks, e.g., 242 within the core memory 244 and an array of voltage generators 246. The X-decoder 240 is coupled to each memory block, e.g., 242 by a separate bus of wordlines, e.g., 246 while the X-decoder is coupled to the array of voltage generators 248 by a generator bus line 250. A block address input line 252 delivers the block address $A_1$ to the X-decoder while a wordline address input line 254 delivers the wordline location $A_2$ within the memory block, e.g., 242 and within the wordline bus, e.g., 246 to the array of voltage generators 248. Inputting that wordline location $A_2$ selects one voltage generator within the array corresponding to or associated with that wordline within the wordline bus.

Although only one of the voltage generators and the associated wordline is selected and generates a wordline source voltage, depending on the reason for accessing the memory cell the other voltage generators may generate voltages and voltages may be applied to their corresponding wordlines. The reasons which can have that influence include whether the operating mode is programming, erasure, or reading. For example, as described above, in a standard NAND-type flash memory device the read operation for one memory cell, e.g., 130 in a string (FIG. 2) applies high voltages to the control gates of the other memory cells 131–145 in the string in order to turn on those memory elements.

FIG. 7 is a mixed block and logic diagram of the X-decoder, together with its inputs and outputs and local pumps 270 (i.e., high voltage sources). The X-decoder has a predecoder stage 340 as well as a final decoder array stage 360 comprising an array of final decoder circuits, e.g., 370. The predecoder stage is shown arbitrarily as generating output on an array 380 of 3-bit buses, e.g., 390. For example, suppose that the address input A is the 9 bits $A_0$ through $A_8$. In this example $A_0$ through $A_8$ would be split into three subgroups of three bits each. Each of $Z_{oi}$, $Z_{1j}$ and $Z_{2k}$ would correspond to one of those subgroups. The $Z_{mn}$ serve as inputs to the final decoder array stage 360. Specifically, $Z_{0i}$ would represent and have the function of the various 8 "anded" combinations or minterms of $A_0$, $A_1$ and $A_2$, e.g., $A_0 \cdot \overline{A}_1 \cdot \overline{A}_2$; $Z_{1j}$ would similarly represent the 8 "anded" combinations of $A_3$, $A_4$, and $A_5$; and $Z_{2k}$ would similarly represent the 8 "anded" combinations of $A_6$, $A_7$ and $A_8$. The advantages of employing a predecoder stage 340 as part of a decoding process are well known in the art. These advantages include reduction in number of transistors, and therefore area, and reduction of the number of inputs on each AND gate, e.g., 400 in the final decoder array stage 360 from 9 to 3. That reduction in number of inputs decreases the fan-out requirement on the initial stage of decoding, i.e. the predecoder stage 340 in this method and a buffer stage in conventional 1-of-n-decoding.

The final decoder array stage 360 is an array of final decoder circuits, e.g., 370, each of which has an "and" function as indicated by the symbol, e.g., 400 in each block of the final stage array 360. In the example shown where the address is $A_0$ through $A_8$, there are $2_9$ final decoder circuits in the array 360. The final decoder array stage in the array 360 ultimately selects one of the memory blocks of the core memory. The final decoder array stage performs that selection through one of the local pumps, e.g., 270 which is ultimately coupled to one of the memory blocks (e.g. 242 of FIG. 6). The local pump employed is the one in the final decoder circuit, e.g., 370 selected by the predecoder 340.

In certain operations of the memory device, more than one memory block will be affected. For example, a group of memory blocks with sequential block addresses may be erased in one operation either simultaneously or sequentially. Each member of the group must be selected by the X-decoder for this operation. This selection can be performed by applying the address signals one by one to the memory device with the addresses being generated individually external to the memory device. The selection can also be performed by applying only the starting address and ending address of the group to the memory device provided that circuitry is available on the memory device to generate all intervening addresses.

As an example of the second approach, an arithmetic circuit, a counter and a comparator can perform the generation of the group of addresses. The starting address is subtracted from the ending address to obtain the total number of memory blocks with successive addresses. The counter is operated that many cycles successively adding one to the starting address. Alternatively, the starting address is increased by one successively, each time comparing the resulting address to the ending address. In either alternative, a number of circuits are employed and numerous cycles of time transpire before all the addresses are generated. Further, these addresses must be stored in registers if the operation is to be a simultaneous one, employing all the addresses at once.

BRIEF SUMMARY OF THE INVENTION

In view of the above, a device for, and method of, performing multi-block selection in a flash memory device is provided. The selecting can be used for the purposes of subsequent erasure, programming, and reading among other purposes.

A first aspect of the present invention is directed towards a method for performing that selecting. The device includes a plurality of memory blocks. Each memory block has a block address comprising a string of bits with each bit situated at a bit location in that string. The method provides for a starting address which is the block address of a memory first block. The method provides as well for an ending address which is the block address of a memory second block.

The method of the invention includes generating one or more sets of pre-decoded z-signals in response to the starting address and the ending address. Each set corresponds to one of the block addresses included in the group comprising the starting address, the ending address and all the block addresses between these two addresses. The method also includes decoding each of those sets to generate one or more signals that select a memory block whose block address is included in that group.

In addition, the method may also be undertaken so that these sets of pre-decoded z-signals are the entirety of the sets of the pre-decoded z-signals corresponding to any of that group of block addresses. In that circumstance, the selecting signals collectively select all the memory blocks whose block addresses are included in that group.

In addition, the device employed in the method may also include a multi-block first bit location. That location is the most significant bit of all the bits where the starting address has a different bit than the ending address. In particular, at the multi-block first bit location the starting address has a logic 0 and the ending address has a logic 1. In this circumstance, the method also includes generating a converted memory block address. In the converted address the bits more significant than the multi-block first bit are the bits of the ending address. The bits less significant than, or equal in significance to, the multi-block first bit are a logic 1. Similarly, the method would include generating a converted complementary memory block address. In this converted address the bits more significant than the multi-block first bit are the complements of the bits of the ending address. The bits less significant than, or equal in significance to, the multi-block first bit are a logic 1. Finally, in this circumstance generating the pre-decoded z-signals is undertaken by pre-decoding the two converted addresses.

In addition, the method may also include comparing the starting addresses and the ending address so as to determine the multi-block first bit location.

A second aspect of the present invention is directed towards a device for performing multi-block selecting. The device includes a plurality of memory blocks. Each memory block has a block address comprising a string of bits with each bit situated at a bit location in that string. A starting address is the block address of a memory first block. An ending address is the block address of a memory second block.

The device includes a pre-decoder stage configured to generate one or more sets of pre-decoded z-signals. Each set corresponds to one of the block addresses included in the group comprising the starting address, the ending address and all the block addresses between those two addresses. The pre-decoder stage operates in response to the starting address and the ending address. The device also includes a final decoder array stage configured to generate one or more signals that select a memory block whose block address is included in that group. The final decoder array stage operates in response to each of the above sets.

In addition, the device may also be configured so that the sets of pre-decoded z-signals are the entirety of the sets of the pre-decoded z-signals corresponding to any of that group of block addresses. In that circumstance the selecting signals collectively select all the memory blocks whose block addresses are included in that group.

In addition, the device may also include a multi-block first bit location. That location is the most significant bit of all the bits where the starting address has a different bit than the ending address. In particular, at the multi-block first bit location the starting address has a logic 0 and the ending address has a logic 1. In this circumstance the device includes a first converter circuit configured to generate a converted memory block address where the bits more significant than the multi-block first bit are the bits of the ending address. The bits less significant than, or equal in significance to, the multi-block first bit are equal to a logic 1. Similarly, the device would include a second converter circuit configured to generate a converted complementary memory block address where the bits more significant than the multi-block first bit are the complements of the bits of the ending address. The bits less significant than, or equal in significance to, the multi-block first bit are equal to a logic 1. Finally, in this circumstance the pre-decoder stage generates the pre-decoded z-signals by pre-decoding the two converted addresses.

In addition, the device may also include a comparator circuit configured to compare the starting address and the ending address so as to determine the multi-block first bit location.

It is therefore a primary advantage of the present invention that the number of circuits necessary to enable a memory device to perform a multi-block operation is reduced.

It is a further advantage of the present invention that as a result the length of time expended by a memory device in performing a multi-block operation is reduced.

It is a further advantage of the present invention that a group of memory blocks can be simultaneously selected.

It is a further advantage of the present invention that a group of memory blocks can be selected by designating the addresses of only two of those blocks.

The following figures and detailed description of the preferred embodiments will more clearly demonstrate these and other objects and advantages of the invention.

BRIEF DESCRIPTION OF SEVERAL VIEWS OF THE DRAWINGS

FIG. 3 depicts an individual memory cell or element under operating conditions of program;

FIG. 4 depicts an individual memory cell or element under operating conditions of erase;

FIG. 5 depicts an individual memory cell or element under operating conditions of read;

FIG. 8 depicts an X-decoding scheme for four bits in one embodiment of the invention;

FIG. 10 depicts one embodiment of an inverter arrangement used in connection with the converted memory block address circuitry;

DETAILED DESCRIPTION OF THE PRESENTLY PREFERRED EMBODIMENTS OF THE INVENTION

Figure 1:
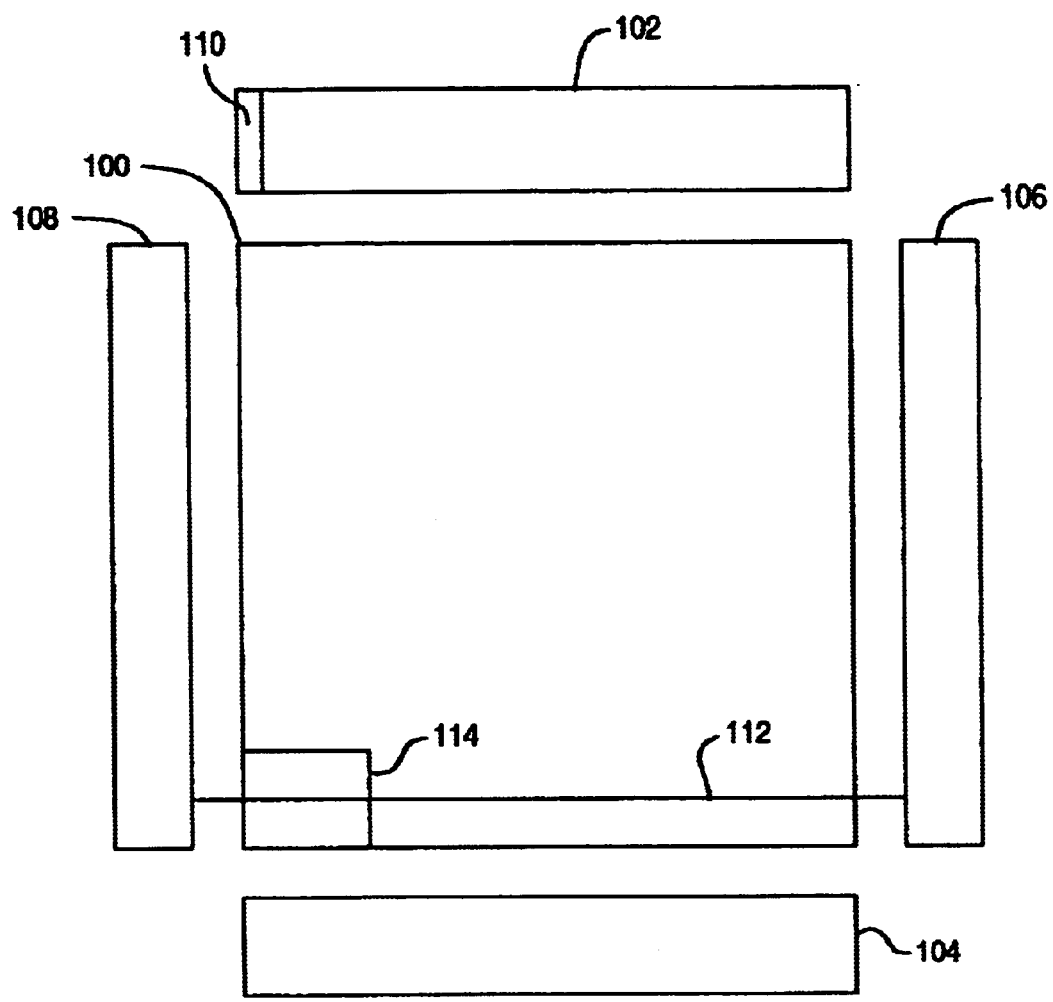
FIG. 1 shows the overall architecture of the memory elements of the NAND-based flash device according to the invention.
Figure 2:
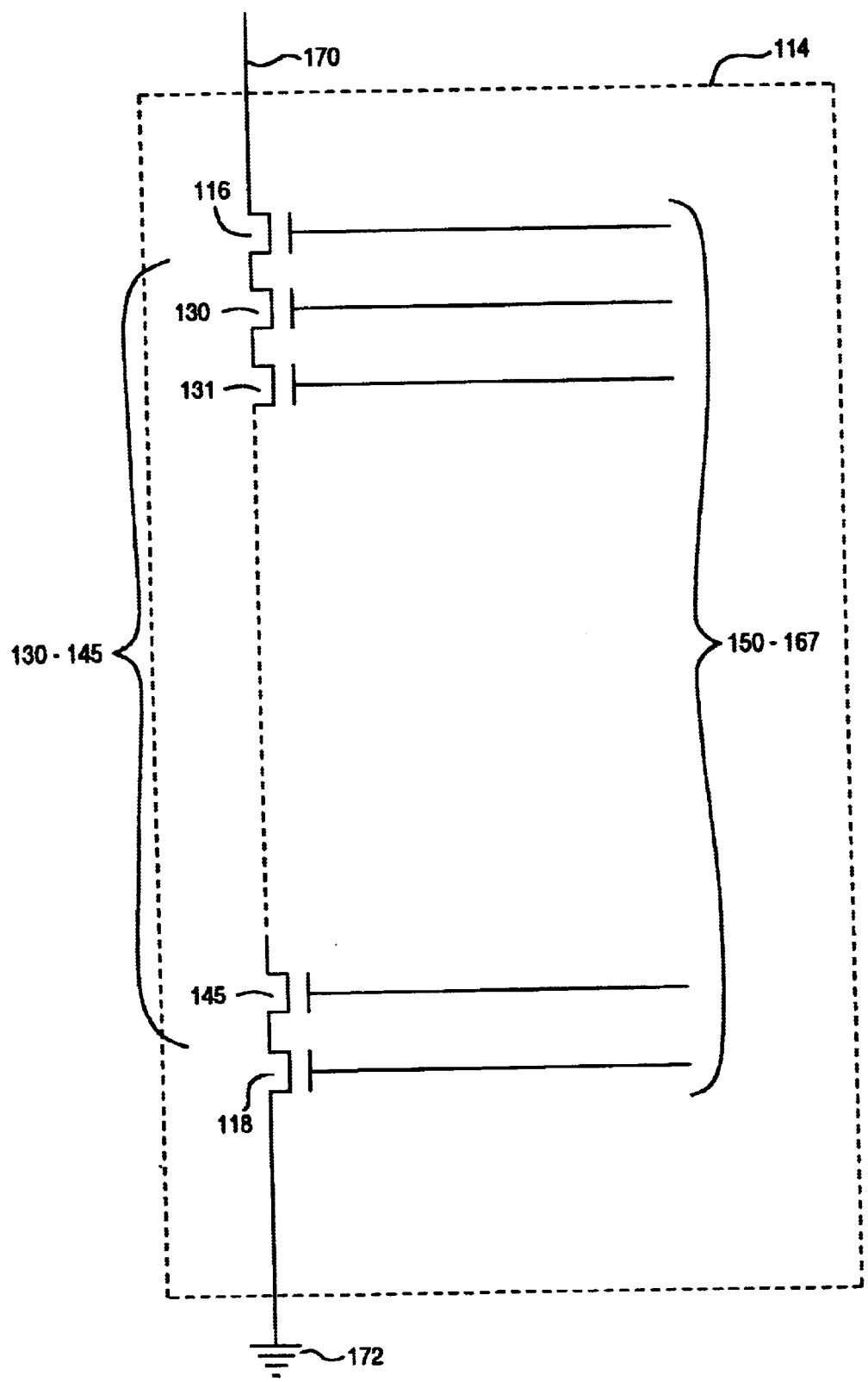
FIG. 2 shows the architecture of one memory block in a NAND-based flash memory device.
Figure 6:
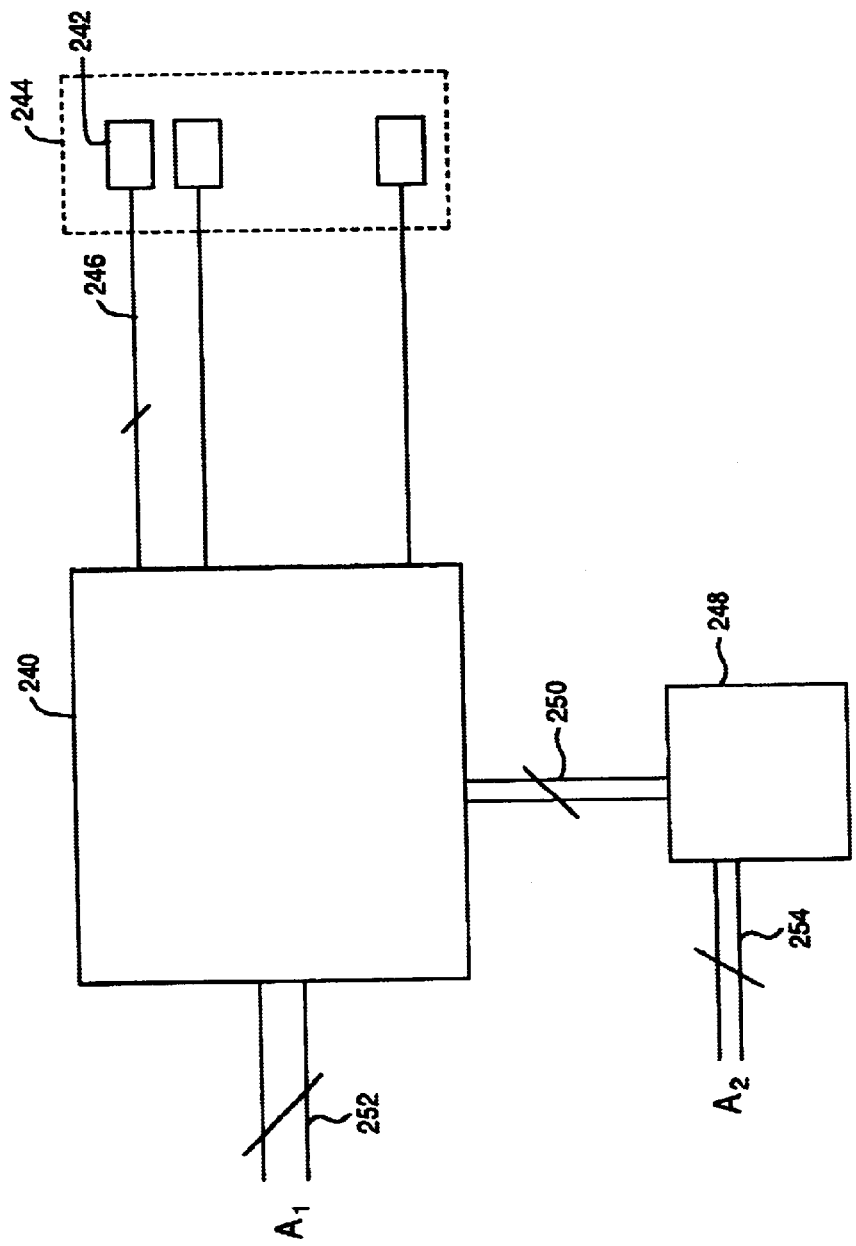
FIG. 6 is a block diagram of a portion of the memory architecture closely related to the X-decoding function.
Figure 7:
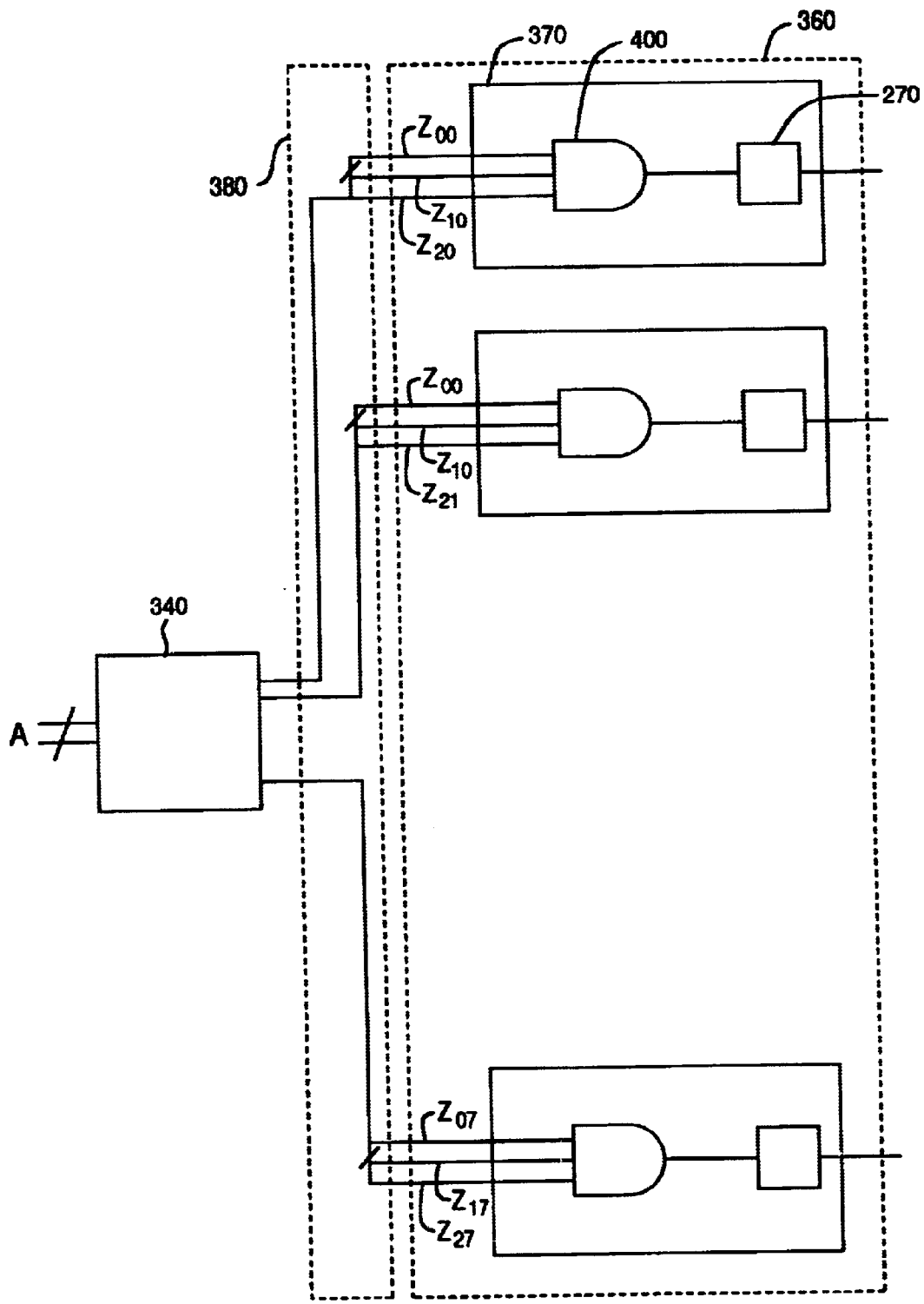
FIG. 7 is a mixed block and logic diagram of the X-decoder.

By observing patterns in the predecoding arrangement, simpler techniques can be used for multi-block selection. FIG. 8 depicts an exemplary X-decoding scheme using both pre-decoder stage and a final decoder array stages. The addresses $A_3 A_2 A_1 A_0$ are 4 bits, corresponding to 16 memory blocks. The pre-decoding scheme generates $Z_{0i}$ from the minterms of $A_0$ and $A_1$ and $Z_{1i}$ from the minterms of $A_2$ and $A_3$. Thus, the table describes $A_1 A_0 = 00$ or $\overline{A_1}\overline{A_0}$ determining $Z_{00}$ and $A_3 A_2 = 01$ or $\overline{A_3}\overline{A_2}$ determining $Z_{11}$. The ones in the columns under the Z's identify which $Z_{ij}$ is determined by the A bits. The zeros in those columns have the function only of helping to identify the space in which the 1 appears.

The set of memory blocks 4 through 7 (left half of FIG. 8) are selected in the final decoder array stage by gates with 2 inputs having $Z_{11}$ paired separately with $Z_{00}$, $Z_{01}$, $Z_{02}$, and $Z_{03}$. In the predecoder stage, $Z_{00}$ results from the first 2 bits of A=0100, i.e., 00. Similarly $Z_{01}$, $Z_{02}$ and $Z_{03}$ result from the first two bits each of A=0101, 0110 and 0111. $Z_{11}$ results from the final two bits of each of those four addresses, i.e. 01. In minterm terminology, $Z_{00}$ results from $\overline{A_1}\overline{A_0}$, $Z_{01}$ from $\overline{A_1}A_0$, $Z_{02}$ from $A_1\overline{A_0}$ and $Z_{03}$ from $A_1 A_0$. These results, however, occur sequentially as the four separate A's for blocks 4 through 7 are applied to the predecoder stage.

Precisely those results would occur simultaneously if the conditions $A_1 A_0 = 11$ and $\overline{A_1}\overline{A_0} = 11$ were met. That is to say, $Z_{00}$, $Z_{01}$, $Z_{02}$ and $Z_{03}$ would be outputted form the pre-decoder stage simultaneously, and at the same time as $Z_{11}$ appears at the pre-decoder stage output. Accordingly the final decoder array will select blocks approximately simultaneously. ($A_3$ and $A_2$ remain at 0 and 1, respectively, and their complements are true complements).

Although in the ordinary course a logical impossibility, that condition can be simulated by simultaneously and artificially applying the signals 11 to the inputs $A_1 A_0$ of the pre-decoder circuits or gates and the signals 11 to the inputs $\overline{A_1}\overline{A_0}$ of the pre-decoder circuits or gates. To achieve that simulation, of course, the circuitry must bypass the inverters which generate $\overline{A_1}$ and $\overline{A_0}$ from $A_1$ and $A_0$, and place 11 directly on the nodes $\overline{A_1}$ and $\overline{A_0}$.

Similarly, to select memory blocks 0 through 7 (right half of FIG. 8) in the final decoder stage array the conditions $A_2 A_1 A_0 = 111$ and $\overline{A_2}\overline{A_1}\overline{A_0} = 111$ should be met. ($A_3$ remains at 0 and its complement is a true complement). In addition to the $Z_1$ pairings used to select memory blocks 4 through 7, memory blocks 0 through 3 are selected by gates with two inputs having $Z_{10}$ paired separately with $Z_{00}$, $Z_{01}$, $Z_{02}$ and $Z_{03}$.

An algorithm can summarize the results of these two examples. Let A be the ending address of the group of memory blocks to be selected. In both examples above A=0111 or 7. A converted memory block address AD is defined where AD(i)=1 if AD(i) is a bit less significant than, or equal in significance to, the multi-block first bit location and AD(i)=A(i) if A(i) is a bit of greater significance than the multi-block first bit location. The multi-block first bit location is by definition the most significant bit location where the ending address has a different bit than the starting address. In the first example, the multi-block bit location is A, while in the second example it is A2. A converted complementary memory block address $\overline{AD}$ is defined where $\overline{AD}(i)=1$ if $\overline{AD}(i)$ is a bit less significant than, or equal in significance to, the multi-block first bit location and $\overline{AD}(i)=\overline{A}(i)$ if AD(i) is a bit of greater significance than the multi-block first bit location. Thus, in the first example of memory blocks 4 to 7, the ending address A is 0111, AD=0111 and $\overline{AD}$=1011. In the second example of memory blocks 0 to 7, the ending address A is again 0111, while AD=0111 again but $\overline{AD}$=1111.

Figure 9:
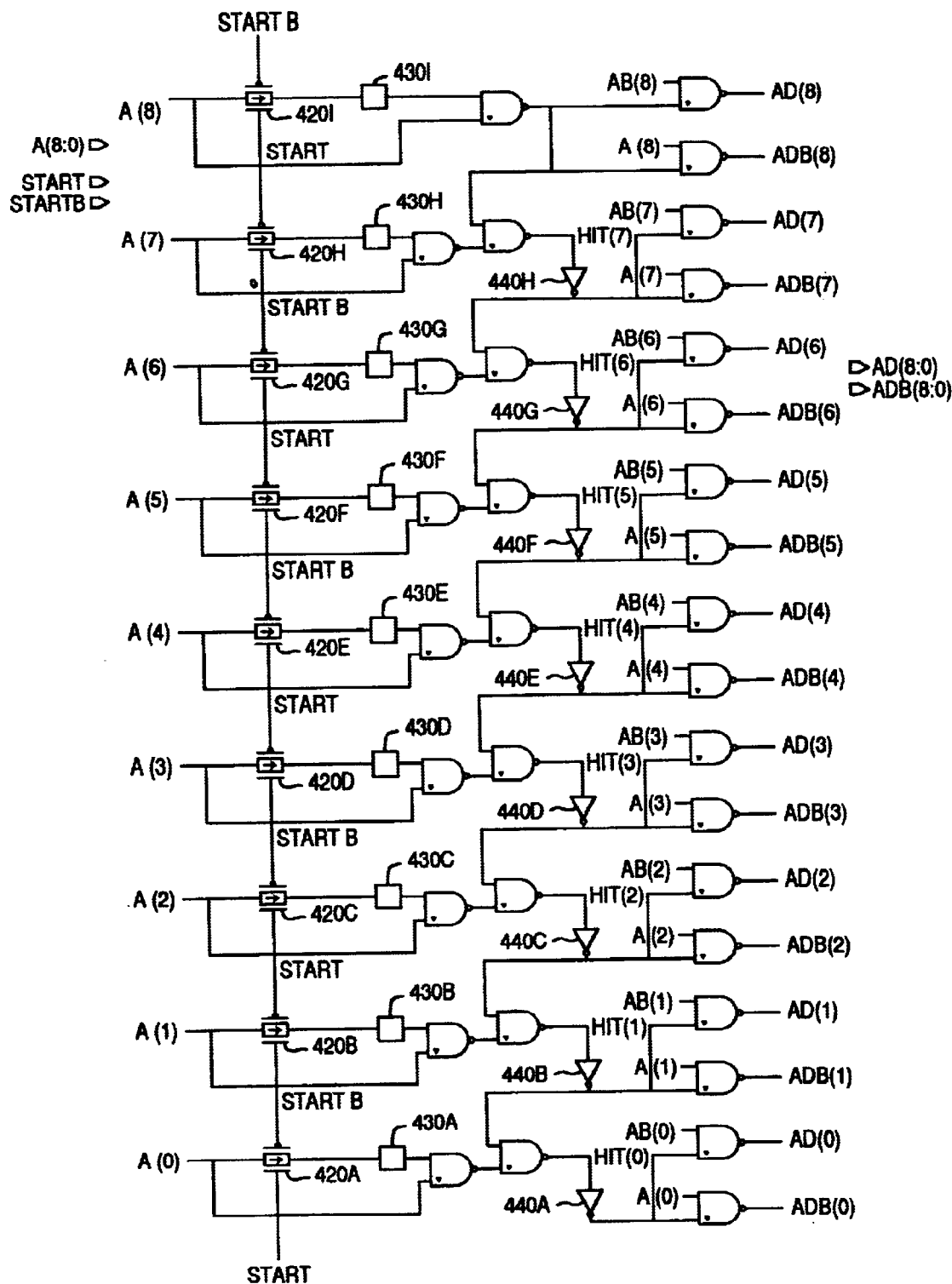
FIG. 9 is a logic diagram of one embodiment of the invention that generates the converted memory block address.

FIG. 9 depicts one embodiment of circuitry that generates the converted memory block address AD(8:0) and the converted complementary memory block address ADB(8:0). In this embodiment the address is nine bits A(8:0). The symbol "B" when used with a signal means the complement of that signal, e.g. "AB" is "$\overline{A}$" and "$\overline{STARTB}$" is START. An exception to this rule is the use of ADB which, as described earlier, is not a true complement of AD.

Initially the starting address of a group of memory blocks is applied to A(8:0) and simultaneously START is applied to the transmission gates 420A–H enabling signal passage through the gates. The output of the transmission gates is stored in the laches 430A–I. At this point the ending address of the group of memory blocks is applied to A(8:0), with START negated, disabling signal passage through the gates. Let HIT(k) be the node at the input to the inverter. At the multi-block first bit location, e.g. A(k), A(k) at START is 0 but at STARTB (or end) is 1. Accordingly, as will be apparent to those of skill in the art, HIT(k) is 1. As will also be apparent to those of skill in the art, that assertion results in assertion of AD(k) and ADB(k) as 1. It will also be apparent to those of skill in the art that HIT(k) is propagated downwards in the circuit schematic and forces assertion of HIT(j) where j<k. Accordingly, all AD(j) and ADB(j) are 1 where j≦k.

FIG. 10 depicts one embodiment of the generation of signals $\overline{A}(8:0)$ from A(8:0) by use of an array of inverters 440A–H.

Figure 11:
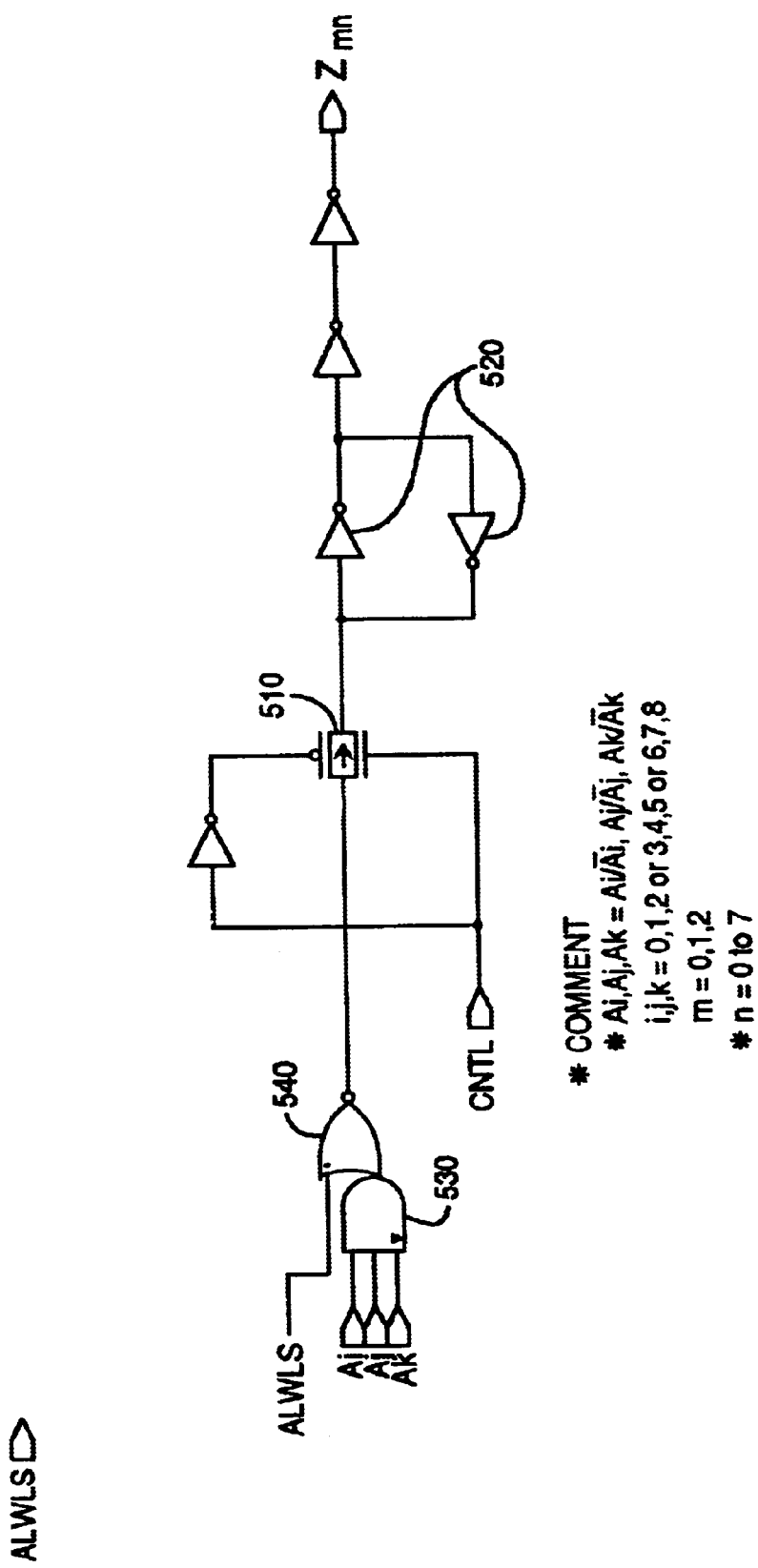
FIG. 11 is a logic diagram of one embodiment of the present invention used in the pre-decoder circuits.

FIG. 11 is a logic diagram of an embodiment of one portion of the predecoder stage, a predecoder circuit. In the predecoding scheme for A(8:0) in this embodiment, the address is split into three subgroups of three bits each; $A_0$, $A_1$ and $A_2$; $A_3$, $A_4$ and $A_5$; and $A_6$, $A_7$, and $A_8$. FIG. 11 shows one of the minterm AND gates for bits $A_i$, $A_j$, $A_k$. For example, i, j, k could=0, 1, 2 and $A_i=A_i$ or $\overline{A}_i$. Similarly $A_j$ represents $A_1$ or $\overline{A}_1$ and $A_k$ represents $A_2$ or $\overline{A}_2$. Specifically, FIG. 11 could depict minterm $A_0\overline{A}_1A_2$. The circuit of FIG. 11 generates $Z_{mn}$ where, m=0 to 2 and n=0 to 7. There will be $2^3$ or 8 such minterm gates for $A_0$, $A_1$ and $A_2$.

Figure 12:
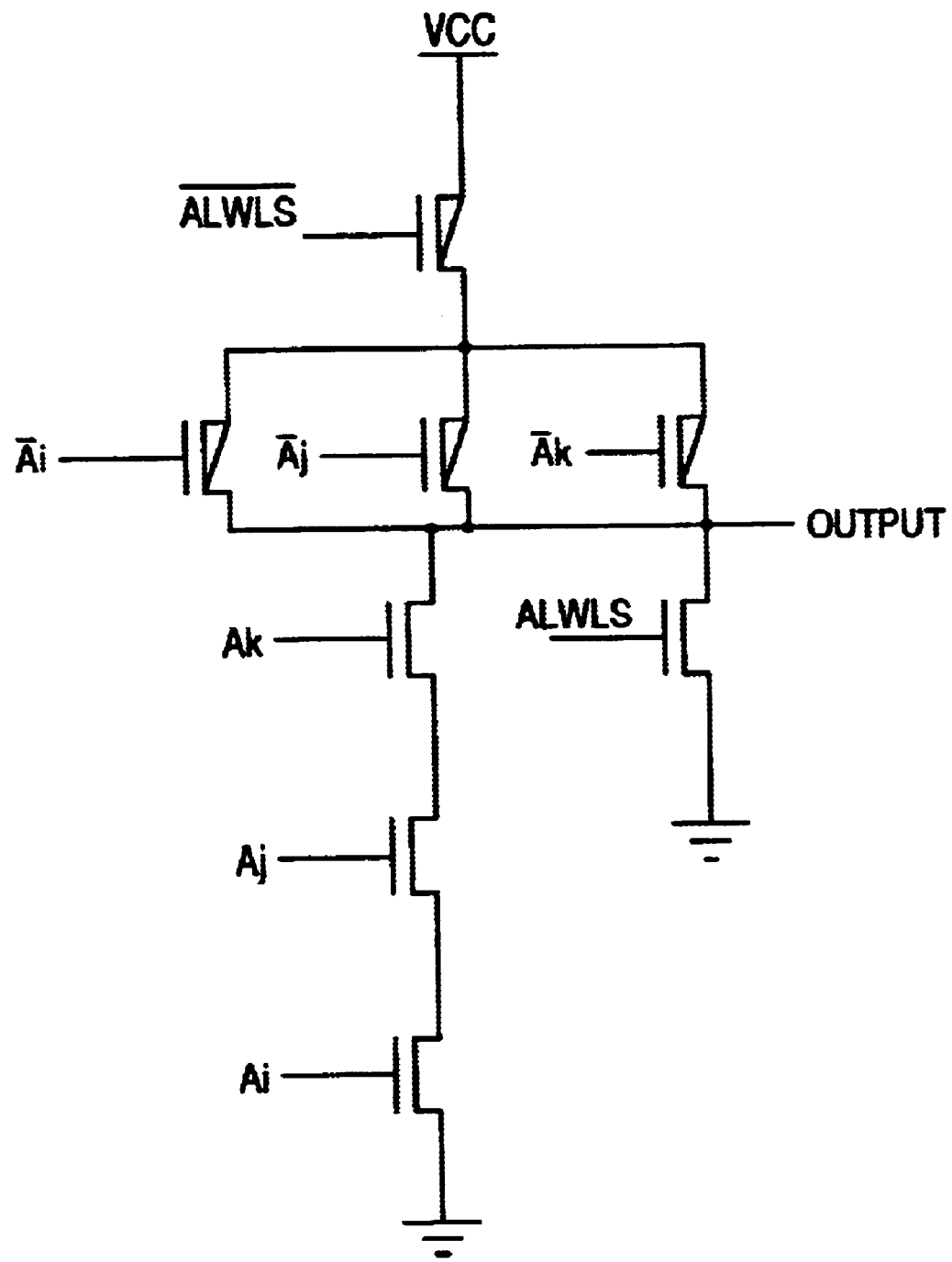
FIG. 12 is a circuit diagram of one embodiment of a portion of the gates used in FIG. 11.

In FIG. 11 a control signal ALWLS can force selection of $Z_{on}$ for certain operations without regard to bits $A_0$, $A_1$ and $A_2$. Signal CNTL turns on or off the minterm output by the use of the transmission gate 510 while the latch 520 preserves the output until needed for use. The physical touching of the AND gate 530 and the NOR gate 540 indicates a special combined circuit realization of those logic functions in one embodiment of the invention. FIG. 12 depicts that realization, as will be apparent to those of skill in the art. This realization has the advantage of employing only eight transistors instead of the 10 transistors which the usual cascade of an AND gate and NOR gate would require in CMOS technology.

Figure 13:
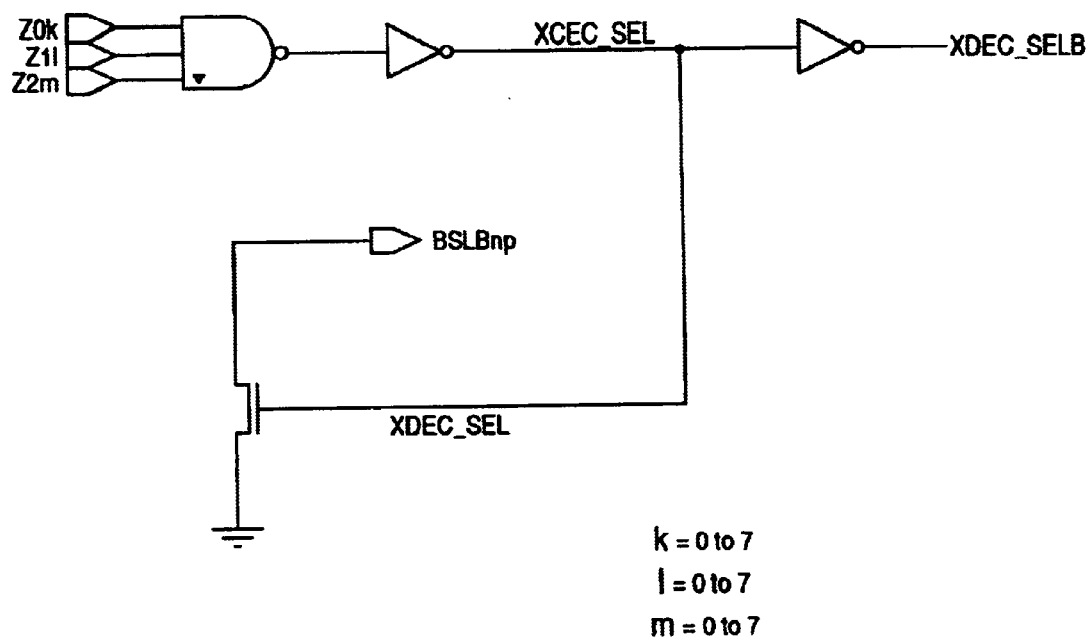
FIG. 13 is a logic diagram of one embodiment of the present invention used in the final decoder circuits.

FIG. 13 depicts an embodiment of a portion of the final decoder array stage, i.e., one of the array of final decoder circuits but without the pump. Subscripts k, l, m each independently range between 0 and 7. As will be apparent to those of skill in the art, XDEC.SEL will be capable of selecting one of the memory blocks. For other uses in auxiliary circuitry, the complement XDEC_SELB is generated and BSLBnp receives a ground voltage.

It will be appreciated by those of skill in the art that the utilization of decoding techniques need not be confined to a core memory arranged in a NAND structure. The scheme could be utilized as readily in a NOR structure core memory. Again, it will be evident to one of skill in the art that the choice of 16 memory elements in a string is only representative of the numerical choices that could be made. Similarly, it will be apparent to one of skill in the art that the use of 3 groups of 3 bits for the X-address input to the predecoding circuit can be varied to meet individual applications and performance requirements.

In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with different memory densities and alternate interface implementations with their accompanying alternate address and control input configurations.

As used herein, various terms and phrases have significance as follows. The term address is intended broadly to refer to any location identifier that uniquely corresponds to, or to the location of, one or more memory cells. The terms and phrases low, logic low, not asserted, not active, and inactive are intended broadly to refer to logic low values of a digital signal, generally understood to represent a binary zero (0). The terms and phrases high, logic high, asserted, and active are intended broadly to refer to logic high values of a digital signal, generally understood to represent a binary one (1). The phrase "A coupled with B" is defined to mean A directly connected to B, or A indirectly connected with B through one or more intermediate components. The term user is intended to refer to a processor or other component or entity seeking access to memory. The term signal refers broadly to an analog or digital signal and encompasses both types of signals.

The steps of the methods recited herein can be performed in any order consistent with the recited acts.

While particular embodiments of the present invention have been and will be shown and described, modifications may be made. For example, the senses of the individual transistors, p-channel and n-channel, may be reversed in suitable applications. It is to be noted that suitable transistor sizes specifying channel width to length ratios (measured in micrometers or microns) for the transistors that make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment. Further, the inventive concepts described herein may be applied to circuits other than memory devices.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

What is claimed is:

1. A method of selecting a plurality of memory blocks in a memory device, each memory block having a block address, each block address comprising a string of bits, each bit having a bit location in the string, the method comprising the acts of:

providing a starting address, the starting address being the block address of a memory first block;

providing an ending address, the ending address being the block address of a memory second block, a multi-block first bit location comprising the most significant bit location of all the bit locations where the starting address has a different bit than the ending address, the multi-block first bit location being a bit location where the starting address has a 0 logic level and the ending address has a 1 logic level;

comparing the starting address and the ending address to determine the multi-block first bit location;

generating a converted memory block address where the bits in the bit locations more significant than the multi-block first bit location are the bits of the ending address at the corresponding bit location and where the bits in the bit locations less significant than, or equal in significance to, the multi-block first bit location are equal to a 1 logic level;

generating a converted complementary memory block address where the bits in the bit locations more significant than the multi-block first bit location are the complements of the bits of the ending address at the corresponding bit location and where the bits in the bit locations less significant than, or equal in significance to, the multi-block first bit location are equal to a 1 logic level;

pre-decoding the converted memory block address and the converted complementary memory block address to generate one or more sets of pre-decoded z-signals, each such set corresponding to one of the block addresses included in a group of block addresses comprising the starting address, the ending address and all the block addresses between the starting address and the ending address; and decoding each of the one or more sets of pre-decoded z-signals to generate one or more selecting signals that select a memory block whose block address is included in said group of block addresses.

2. The method of selecting a plurality of memory blocks in a memory device according to claim 1 wherein:

the generating of the one or more sets of pre-decoded Z-signals is substantially simultaneous;

the generating of the one or more selecting signals is substantially simultaneous;

the one or more sets of pre-decoded z-signals are all of the sets of the pre-decoded z-signals, each of which corresponds to said one of the block addresses; and the one or more selecting signals collectively select all the memory blocks whose block addresses are included in said group of block addresses.

3. A method of selecting a plurality of memory blocks in a memory device, each memory block having a block address, each block address comprising a string of bits, each bit having a bit location in the string, the method comprising the acts of:

providing a starting address, the starting address being the block address of a memory first block;

providing an ending Address, the ending address being the block address of a memory second block;

generating one or more sets of pre-decoded z-signals in response to the starting address and the ending address, each such set corresponding to one of the block addresses included in a group of block addresses comprising the starting address, the ending address and all the block addresses between the starting address and the ending address;

decoding each of the one or more sets of pre-decoded z-signals to generate one or more selecting signals that select a memory block whose block address is included in said group of block addresses; wherein:

the one or more sets of pre-decoded z-signals are all of the sets of the pre-decoded z-signals, each of which corresponds to a block address in said group of block addresses; and the one or more selecting signals collectively select all the memory blocks whose block addresses are included in said group of block addresses.

4. A method of selecting a plurality of memory blocks in a memory device, each memory block having a block address, each block address comprising a string of bits, each bit having a bit location in the string, the method comprising the acts of:

providing a starting address, the starting address being the block address of a memory first block;

providing an ending address, the ending address being the block address of a memory second block;

generating one or more sets of pre-decoded z-signals in response to the starting address and the ending address, each such set corresponding to one of the block addresses included in a group of block addresses comprising the starting address, the ending address and all the block addresses between the starting address and the ending address;

decoding each of the one or more sets of pre-decoded z-signals to generate one or more selecting signals that select a memory block whose block address is included in said group of block addresses;

the device comprising a multi-block first bit location comprising the most significant bit location of all the bit locations where the starting address has a different bit than the ending address, the multi-block first bit location being a bit location where the starting address has a 0 logic level and the ending address has a 1 logic level;

the method further comprising the acts of:

generating a converted memory block address where:
the bits in the bit locations more significant than the multi-block first bit location are the bits of the ending address at the corresponding bit location and where the bits in the bit locations less significant than, or equal in significance to, the multi-block first bit location are equal to a 1 logic level;

generating a converted complementary memory block address where the bits in the bit locations more significant than the multi-block first bit location are the complements of the bits of the ending address at the corresponding bit location and where the bits in the bit locations less significant than, or equal in significance to, the multi-block first bit location are equal to a 1 logic level; and wherein the act of generating the one or more sets of pre-decoded z-signals is the act of pre-decoding the converted memory block address and the converted complementary memory block address to generate the one or more sets of pre-decoded z-signals.

5. The method of selecting a plurality of memory blocks in a memory device according to claim 4 wherein:

the generating of the one or more sets of pre-decoded Z-signals is substantially simultaneous;

the generating of the one or more selecting signals is substantially simultaneous;

the one or more sets of pre-decoded z-signals are all of the sets of the pre-decoded z-signals, each of which corresponds to said one of the block addresses; and the one or more selecting signals collectively select all the memory blocks whose block addresses are included in said group of block addresses.

6. The method of selecting a plurality of memory blocks in a memory device according to claim 4 further comprising the act of comparing the starting address and the ending address to determine the multi-block first bit location.

7. The method of selecting a plurality of memory blocks in a memory device according to claim 6 wherein:

the one or more sets of pre-decoded z-signals are all of the sets of the pre-decoded z-signals, each of which corresponds to said one of the block addresses; and the one or more selecting signals collectively select all the memory blocks whose block addresses are included in said group of block addresses.

8. A flash memory device comprising:
a plurality of memory blocks, each memory block having a block address, each block address comprising a string of bits, each bit having a bit location in the string;
a memory first block having a block address comprising a starting address;
a memory second block having a block address comprising an ending address;
a multi-block first bit location comprising the most significant bit location of all the bit locations where the starting address has a different bit than the ending address, the multi-block first bit location being a bit location where the starting address has a 0 logic level and the ending address has a 1 logic level;
a comparator circuit configured to compare the starting address and the ending address to determine the multi-block first bit location;
a first converter circuit configured to generate a converted memory block address where the bits in the bit locations more significant than the multi-block first bit location are the bits of the ending address at the corresponding bit location and where the bits in the bit locations less significant than, or equal in significance to, the multi-block first bit location are equal to a 1 logic level;
a second converter circuit configured to generate a converted complementary memory block address where the bits in the bit locations more significant than the multi-block first bit location are the complements of the bits of the ending address at the corresponding bit location and where the bits in the bit locations less significant than, or equal in significance to, the multi-block first bit location are equal to a 1 logic level;
a pre-decoder stage configured to generate one or more sets of pre-decoded z-signals, each such set corresponding to one of the block addresses included in a group of block addresses comprising the starting address, the ending address and all the block addresses between the starting address and the ending address, the pre-decoder stage configured to perform such generation in response to the converted memory block address and the converted complementary memory block address; and
a final decoder array stage configured to generate one or more selecting signals that select a memory block whose block address is included in said group of block addresses, the final decoder array stage configured to perform such generation in response to each of the one or more sets of pre-decoded z-signals.

9. The flash memory device according to claim 8 wherein:
the generating of the one or more sets of pre-decoded Z-signals is substantially simultaneous;
the generating of the one or more selecting signals is substantially simultaneous;
the one or more sets of pre-decoded z-signals are all of the sets of the pre-decoded z-signals, each of which corresponds to said one of the block addresses; and
the one or more selecting signals collectively select all the memory blocks whose block addresses are included in said group of block addresses.

10. A flash memory device comprising:
a plurality of memory blocks, each memory block having a block address, each block address comprising a string of bits, each bit having a bit location in the string;
a memory first block having a block address comprising a starting address;
a memory second block having a block address comprising an ending address;
a pre-decoder stage configured to generate one or more sets of pre-decoded z-signals, each such set corresponding to one of the block addresses included in a group of block addresses comprising the starting address, the ending address and all the block addresses between the starting address and the ending address, the pre-decoder stage configured to perform such generation in response to the starting address and the ending address;
a final decoder array stage configured to generate one or more selecting signals that select a memory block whose block address is included in said group of block addresses, the final decoder array stage configured to perform such generation in response to each of the one or more sets of pre-decoded z-signals; wherein:
the one or more sets of pre-decoded z-signals are all of the sets of the pre-decoded z-signals, each of which corresponds to a block address in said group of block addresses; and
the one or more selecting signals collectively select all the memory blocks whose block addresses are included in said group of block addresses.

11. A flash memory device comprising:
a plurality of memory blocks, each memory block having a block address, each block address comprising a string of bits, each bit having a bit location in the string;
a memory first block having a block address comprising a starting address;
a memory second block having a block address comprising an ending address;
a pre-decoder stage configured to generate one or more sets of pre-decoded z-signals, each such set corresponding to one of the block addresses included in a group of block addresses comprising the starting address, the ending address and all the block addresses between the starting address and the ending address, the pre-decoder stage configured to perform such generation in response to the starting address and the ending address;
a final decoder array stage configured to generate one or more selecting signals that select a memory block whose block address is included in said group of block addresses, the final decoder array stage configured to perform such generation in response to each of the one or more sets of pre-decoded z-signals;
a multi-block first bit location comprising the most significant bit location of all the bit locations where the starting address has a different bit than the ending address, the multi-block first bit location being a bit location where the starting address has a 0 logic level and the ending address has a 1 logic level;
a first converter circuit configured to generate a converted memory block address where the bits in the bit locations more significant than the multi-block first bit location are the bits of the ending address at the corresponding bit location and where the bits in the bit locations less significant than, or equal in significance to, the multi-block first bit location are equal to a 1 logic level;
a second converter circuit configured to generate a converted complementary memory block address where the bits in the bit locations more significant than the multi-block first bit location are the complements of the bits of the ending address at the corresponding bit location and where the bits in the bit locations less significant than, or equal in significance to, the multi-block first bit location are equal to a 1 logic level; and wherein the pre-decoder stage generates the one or more sets of pre-decoded z-signals by pre-decoding the converted memory block address and the converted complementary memory block address.

12. The flash memory device according to claim 11 wherein:

the generating of the one or more sets of pre-decoded Z-signals is substantially simultaneous;

the generating of the one or more selecting signals is substantially simultaneous;

the one or more sets of pre-decoded z-signals are all of the sets of the pre-decoded z-signals, each of which corresponds to said one of the block addresses; and the one or more selecting signals collectively select all the memory blocks whose block addresses are included in said group of block addresses.

13. The flash memory device according to claim 11 further comprising a comparator circuit configured to compare the starting address and the ending address to determine the multi-block first bit location.

14. The flash memory device according to claim 13 wherein:

the one or more sets of pre-decoded z-signals are all of the sets of the pre-decoded z-signals, each of which corresponds to said one of the block addresses; and the one or more selecting signals collectively select all the memory blocks whose block addresses are included in said group of block addresses.

* * * * *